US010971570B2

(12) United States Patent
Liu et al.

(10) Patent No.: US 10,971,570 B2
(45) Date of Patent: Apr. 6, 2021

(54) DISPLAY DEVICE AND BRIGHTNESS DETECTION METHOD THEREFOR

(71) Applicant: BOE TECHNOLOGY GROUP CO., LTD., Beijing (CN)

(72) Inventors: Libin Liu, Beijing (CN); Hao Zhang, Beijing (CN); Renrong Gai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/622,618

(22) PCT Filed: May 15, 2019

(86) PCT No.: PCT/CN2019/087095
§ 371 (c)(1),
(2) Date: Dec. 13, 2019

(87) PCT Pub. No.: WO2019/219033
PCT Pub. Date: Nov. 21, 2019

(65) Prior Publication Data
US 2021/0013283 A1    Jan. 14, 2021

(30) Foreign Application Priority Data
May 16, 2018  (CN) .......................... 201810469356.8

(51) Int. Cl.
H01L 27/32      (2006.01)
G09G 3/3225    (2016.01)

(52) U.S. Cl.
CPC ....... H01L 27/3269 (2013.01); G09G 3/3225 (2013.01); H01L 27/3211 (2013.01);
(Continued)

(58) Field of Classification Search
CPC ......... G09G 3/3225; G09G 2320/0686; G09G 2320/0233; G09G 2320/0626;
(Continued)

(56) References Cited

U.S. PATENT DOCUMENTS 9,355,591 B2   5/2016  Eom et al.
9,865,658 B2   1/2018  Heo
(Continued)

FOREIGN PATENT DOCUMENTS

CN    1366653 A      8/2002
CN    101369418 A    2/2009
(Continued)

OTHER PUBLICATIONS

Chinese Office Action dated Jun. 8, 2020, from application No. 201810469356.8.
(Continued)

Primary Examiner — Brent D Castiaux
(74) Attorney, Agent, or Firm — Arch & Lake LLP

(57) ABSTRACT

A display device includes a display layer, at least one brightness detecting unit group disposed on a light emitting side of the display layer, and a control module coupled to each of the brightness detecting units. The display layer includes a plurality of display units. Each display unit includes at least one sub-pixel. Each brightness detecting unit group includes a plurality of brightness detecting units, an orthographic projection of one brightness detecting unit on the display layer has an overlapping area with an arranging area of one display unit on the display layer. Respective portions, lying in overlapping areas, of the display units corresponding to different brightness detecting units in the same brightness detecting unit group are the same.

17 Claims, 4 Drawing Sheets

(52) U.S. Cl.
CPC ............... *G09G 2320/0233* (2013.01); *G09G 2320/0626* (2013.01); *G09G 2320/0686* (2013.01); *G09G 2360/148* (2013.01)

(58) Field of Classification Search
CPC ........... G09G 2360/148; G09G 3/3648; G09G 3/006; G09G 2300/043; G09G 2330/12; G09G 2380/02; H01L 27/3269; H01L 27/3211
See application file for complete search history.

(56) References Cited

U.S. PATENT DOCUMENTS

| | | | |
|---|---|---|---|
| 9,905,198 B2 | 2/2018 | Huang et al. | |
| 2006/0220576 A1* | 10/2006 | Lim | G09G 3/22 315/169.1 |
| 2009/0201228 A1* | 8/2009 | Kim | H01L 27/14692 345/60 |
| 2014/0320553 A1 | 10/2014 | Eom et al. | |
| 2016/0226030 A1 | 8/2016 | Heo | |
| 2016/0365067 A1 | 12/2016 | Huang et al. | |
| 2017/0287392 A1* | 10/2017 | Lynch | G09G 3/3208 |

FOREIGN PATENT DOCUMENTS

| | | |
|---|---|---|
| CN | 101751858 A | 6/2010 |
| CN | 105070237 A | 11/2015 |
| CN | 105095883 A | 11/2015 |
| CN | 105261334 A | 1/2016 |
| CN | 105374340 A | 3/2016 |
| CN | 105845705 A | 8/2016 |
| CN | 106887212 A | 6/2017 |
| CN | 107256880 A | 10/2017 |
| CN | 107731157 A | 2/2018 |
| CN | 105261334 B | 4/2018 |
| CN | 108682390 A | 10/2018 |
| JP | H1115437 A | 1/1999 |

OTHER PUBLICATIONS

Chinese Office Action dated Mar. 4, 2020, from application No. 201810469356.8.
Chinese Office Action dated Oct. 22, 2019, from application No. 201810469356.8.
International Search Report and Written Opinion dated Jul. 25, 2019, from application No. PCT/CN2019/087095.

* cited by examiner

DISPLAY DEVICE AND BRIGHTNESS DETECTION METHOD THEREFOR

CROSS-REFERENCE TO RELATED APPLICATIONS

This application is based upon International Application No. PCT/CN2019/087095, filed on May 15, 2019, which is based upon and claims the priority of the Chinese Patent Application No. 201810469356.8, entitled "DISPLAY DEVICE AND BRIGHTNESS DETECTING METHOD THEREOF", filed with the Chinese Patent Office on May 16, 2018, the entire contents of which are hereby incorporated by reference.

TECHNICAL FIELD

The present disclosure relates to the field of display technologies, in particular, relates to a display device and a brightness detecting method thereof.

BACKGROUND

In recent years, organic light emitting diodes (OLEDs) have been widely used in high-performance display devices such as a flexible display device due to their advantages of self-luminous property, wide viewing angle, short response, high luminous efficiency, wide color gamut, and low power consumption.

SUMMARY

In an aspect, there is provided a display device. The display device includes a display layer, at least one brightness detecting unit group disposed on a light emitting side of the display layer, and a control module. Each of the brightness detecting unit group includes a plurality of brightness detecting units. An orthographic projection of one of the brightness detecting units on the display layer has an overlapping area with an arranging area of one of the display units on the display layer. Respective portions, lying in the overlapping areas, of the display units corresponding to different brightness detecting units in the same brightness detecting unit group are the same. The control module is coupled to each of the brightness detecting units. The plurality of brightness detecting units in the same brightness detecting unit group are configured to, when corresponding display units display same image data, respectively detect actual brightness data of the display unit corresponding to each of the brightness detecting units, and transmit a plurality of actual brightness data to the control module. The control module is configured to receive the actual brightness data transmitted by each of the brightness detecting units. When the actual brightness data does not coincide with target brightness data, determine brightness compensation data of the display unit to which the actual brightness data belongs according to a difference between the actual brightness data and the target brightness data.

In some arrangements, each of the brightness detecting units includes a first electrode, a photosensitive layer, and a second electrode which are sequentially disposed in a direction away from the display layer, and a resistance value of the photosensitive layer varies according to an intensity of light irradiated on the photosensitive layer. The control module is coupled to the first electrode and the second electrode in each of the brightness detecting units. The control module is configured to apply different potentials to the first electrode and the second electrode in each of the brightness detecting units and acquire current output by each of brightness detecting units from one of the first electrode and the second electrode in each of the brightness detecting units, to determine the actual brightness data of the display unit corresponding to each of the brightness detecting units according to the current.

In some arrangements, each of the brightness detecting units further includes a switching transistor, and the switching transistor includes a drain electrode coupled to one of the first electrode and the second electrode, and a source electrode and a gate electrode respectively coupled to the control module. The switching transistor is configured to, after being turned on by the control module, input the current output from the one of the first electrode and the second electrode coupled to the drain electrode to the control module.

In some arrangements, the first electrode is a transparent electrode.

In some arrangements, the photosensitive layer is a photosensitive transparent layer.

In some arrangements, the second electrode is a transparent electrode.

In some arrangements, each of the display units is one sub-pixel, and each of the sub-pixels corresponds to one of the brightness detecting units.

In some arrangements, the display device further includes an array substrate. The array substrate includes a pixel driving circuit corresponding to each of the sub-pixels, and each of the pixel driving circuits includes a driving transistor. The source electrode of the switching transistor and a source electrode of the driving transistor corresponding to a same sub-pixel are coupled to each other.

In some arrangements, the gate electrode of the switching transistor and a gate electrode of the driving transistor corresponding to the same sub-pixel are coupled to each other.

In another aspect, there is provided a brightness detecting method for a display device, for detecting the display device described above. The brightness detecting method includes controlling the plurality of display units in the display layer to display same image data. The plurality of display units correspond to the at least one brightness detecting unit group. The brightness detecting method includes respectively detecting actual brightness data of each of the plurality of display units, and determining whether the actual brightness data coincides with target brightness data. The brightness detecting method includes determining brightness compensation data of the display unit to which the actual brightness data belongs according to a difference between the actual brightness data and the target brightness data when the actual brightness data does not coincide with the target brightness data.

In some arrangements, the brightness detecting method further includes performing brightness compensation on the display unit to which the actual brightness data belongs according to the brightness compensation data.

In some arrangements, each of the display units is one of the sub-pixels, and each of the sub-pixels corresponds to one of the brightness detecting units. Respectively detecting actual brightness data of each of the plurality of display units further includes respectively detecting the actual brightness data of each of the sub-pixels in the display layer.

In some arrangements, the plurality of display units are arranged in an array. The respectively detecting actual brightness data of each of the plurality of display units further includes detecting the actual brightness data of each of the plurality of display units row by row.

BRIEF DESCRIPTION OF THE DRAWINGS

The accompanying drawings described herein, which are intended to provide a further understanding of the present disclosure, are a part of the present disclosure. The illustrative arrangements of the present disclosure and the description thereof are for explaining the present disclosure and do not constitute an undue limitation of the present disclosure. In the drawing.

DETAILED DESCRIPTION

Hereinafter, the technical solutions in arrangements of the present disclosure will be described clearly and completely with reference to the accompanying drawings in the arrangements of the present disclosure. Apparently, the described arrangements are only a part of the arrangements of the present disclosure, and not all arrangements. All other arrangements obtained by those of ordinary skill in the art based on the arrangements of the present disclosure are within the scope of the disclosure.

When a flexible display device is bent or folded, the display brightness of the deformed area tends to be changed with respect to the display brightness of the undeformed area, resulting in a problem that the display brightness of the flexible display device is uneven. In addition, if a local transparent display area is disposed in the flexible display device, since the pixel density (pixel per inch, PPI) of the transparent display area is high and the light transmittance is low, the display brightness of the transparent display area tends to be lower than the display brightness of other display areas in the flexible display device, further causing a problem that the display brightness of the flexible display device is uneven.

Figure 1:
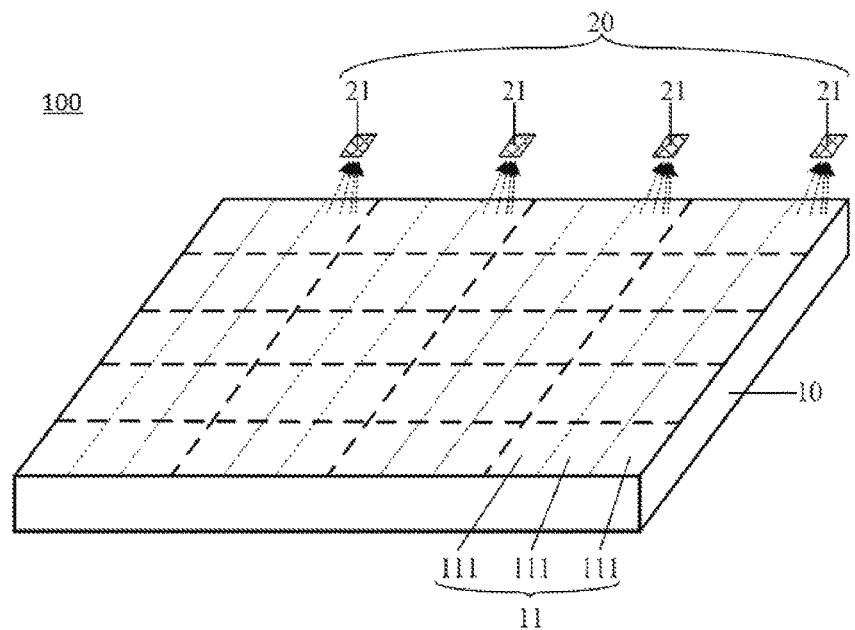
FIG. 1 is a diagram of a positional relationship between a brightness detecting unit group and a display layer according to some arrangements of the present disclosure.
Figure 2:
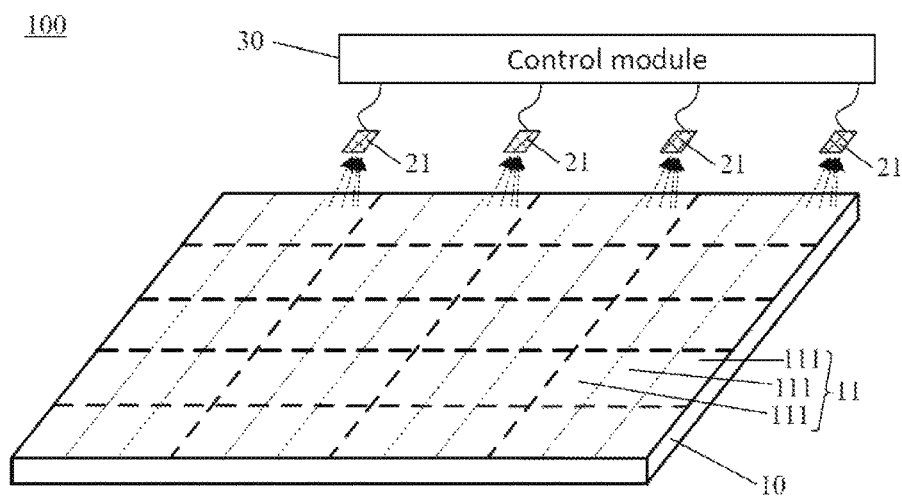
FIG. 2 is a schematic structural diagram of a display device according to some arrangements of the present disclosure.

Some arrangements of the present disclosure provide a display device 100, as shown in FIGS. 1 and 2. The display device 100 includes a display layer 10 including a plurality of display units 11, each of which includes at least one sub-pixel 111.

The display device further includes at least one brightness detecting unit group 20 disposed on a light emitting side of the display layer 10, and each of the brightness detecting unit group 20 includes a plurality of brightness detecting units 21. An orthographic projection of one of the brightness detecting units 21 on the display layer 10 has an overlapping area with an arranging area of one of the display units 11 on the display layer 10, and portions, lying in the overlapping areas, of the display units 11 corresponding to different brightness detecting units in a same brightness detecting unit group 20 are same.

The display device also includes a control module 30 coupled to each of the brightness detecting units 21. The plurality of brightness detecting units 21 in the same brightness detecting unit group 20 are configured to, when corresponding display units 11 display same image data, respectively detect actual brightness data of the display unit 11 corresponding to each of the brightness detecting units 21, and transmit a plurality of actual brightness data to the control module 30. The control module 30 is configured to receive the actual brightness data transmitted by each of the brightness detecting units 21, and when the actual brightness data does not coincide with target brightness data, determine brightness compensation data of the display unit 11 to which the actual brightness data belongs according to a difference between the actual brightness data and the target brightness data.

Here, each of the brightness detecting units 21 is configured to detect the brightness of the emitted light from the corresponding display unit 11 during display. In some examples, each display unit 11 is one sub-pixel 111, and each sub-pixel 111 corresponds to one brightness detecting unit 21.

The display device 100 is a display panel or a display including a display panel. The control module 30 is a control integrated circuit (IC) or other control device having a control function.

In some examples, the display device 100 is an OLED display panel. In the OLED display panel, the display layer 10 includes a pixel defining layer and an OLED disposed in each of the opening areas of the pixel defining layer. The OLED is composed of an anode, a cathode, and a light emitting functional layer disposed between the anode and the cathode. Sub-pixels in the display layer 10 of the OLED display panel are defined by the pixel defining layer.

In other examples, the display device 100 is a liquid crystal display (LCD). In the LCD, the display layer 10 includes a liquid crystal layer and a common electrode layer and a pixel electrode layer disposed on two sides of the liquid crystal layer. The pixel electrode layer is usually disposed on an array substrate, and the common electrode layer is usually disposed on a color filter substrate. The sub-pixels in the display layer 10 of the LCD are defined by a plurality of gate lines and a plurality of data lines which are crossed in the array substrate.

The above at least one brightness detecting unit group 20 is disposed on the light emitting side of the display layer 10, for example, outside the display panel to which the display layer 10 belongs, or, for example, integrated in the display panel to which the display layer 10 belongs, which is not limited in some arrangements of the present disclosure, as long as the at least one brightness detecting unit group 20 can detect the light signal emitted from the corresponding display unit 11 in the display layer 10.

It is described above that an orthographic projection of one of the brightness detecting units 21 on the display layer 10 has an overlapping area with an arranging area of one of the display units 11 on the display layer 10, which means that the orthographic projection of any one of the brightness detecting units 21 on the display layer 10 is at least partially overlapped with the arranging area of only one of the display units 11 on the display layer 10, and is not overlapped with the arranging areas of other display units 11 on the display layer 10, so that one of the brightness detecting units 21 can accurately detect the brightness of the emitted light from one of the display units 11.

Here, the arranging area of one of the display units 11 on the display layer 10 is a planar area, that is, an area where an orthographic projection of a surface of the display unit 11 adjacent to the brightness detecting unit 21 on the display layer 10 lies.

In some arrangements, when each of the display units 11 includes at least one sub-pixel 111, the description of that an orthographic projection of one of the brightness detecting units 21 on the display layer 10 has an overlapping area with an arranging area of one of the display units 11 on the display layer 10 includes the following five cases.

The first case is that: one display unit 11 includes one sub-pixel 111, and the orthographic projection of one brightness detecting unit 21 on the display layer 10 is overlapped or substantially overlapped with the arranging area of one sub-pixel on the display layer 10.

The second is that: one display unit 11 includes one sub-pixel 111, and the orthographic projection of one brightness detecting unit 21 on the display layer 10 is overlapped with a part of the arranging area of one sub-pixel on the display layer 10, that is, the orthographic projection of one brightness detecting unit 21 on the display layer 10 is within the arranging area of one sub-pixel on the display layer 10.

The third case is that: one display unit 11 includes a plurality of sub-pixels, for example, one display unit 11 includes one pixel including three sub-pixels, and the orthographic projection of one brightness detecting unit 21 on the display layer 10 is overlapped or substantially overlapped with the arranging area of one pixel on the display layer 10.

The fourth case is that: one display unit 11 includes a plurality of sub-pixels, for example, one display unit 11 includes one pixel including three sub-pixels, and the orthographic projection of one brightness detecting unit 21 on the display layer 10 is overlapped with a part of the arranging area of each of the sub-pixels in the one pixel on the display layer 10.

The fifth case is that: one display unit 11 includes a plurality of sub-pixels, for example, one display unit 11 includes one pixel including at least three sub-pixels, and the orthographic projection of one brightness detecting unit 21 on the display layer 10 is overlapped, substantially overlapped or partially overlapped with the arranging area of some sub-pixels in one pixel on the display layer 10.

Here, in the above five cases, none of the plurality of brightness detecting units 21 affects normal display of the display device 100.

It is described above that portions, lying in the corresponding overlapping areas, of the display units corresponding to different brightness detecting units 11 in a same brightness detecting unit group 20 are same, which means that: the orthographic projection of each of the brightness detecting units 21 in one brightness detecting unit group 20 on the display layer 10 has an overlapping area with the arranging area of the corresponding display unit 11 on the display layer 10, and the ranges of a plurality of overlapping areas are same. Moreover, when each of the display units 11 is configured to emit colored light, the colors on the corresponding brightness detecting units 21 due to irradiation by the light emitted from the portions of different display units 11 lying in the above overlapping areas are the same.

In view of above, when each display unit 11 includes a plurality of sub-pixels configured to emit lights of different colors, and the orthographic projection of each of the brightness detecting units 21 on the display layer 10 is overlapped with the arranging areas of the plurality of sub-pixels 111 in one display unit 11 on the display layer 10, the ranges of the corresponding light detecting units 21 that are irradiated by the lights emitted from the sub-pixels of different display unites 10 emitting lights of same color are the same.

For example, the display device 100 adopts a display mode of RGB colors, and one display unit 11 includes one pixel including a red sub-pixel R, a green sub-pixel G, and a blue sub-pixel B.

If one of the brightness detecting units 21 in one brightness detecting unit group 20 is irradiated by the light emitted from the green sub-pixel G in the corresponding display unit 11, and the orthographic projection of the brightness detecting unit 21 on the display layer 10 is overlapped with a half of the arranging area of the green sub-pixel G on the display layer 10, other brightness detecting units 21 in the brightness detecting unit group 20 can also be irradiated by the lights emitted by the green sub-pixels G in the corresponding display units 11, and the orthographic projection of each of the brightness detecting units 21 on the display layer 10 is overlapped with a half of the arranging area of the corresponding green sub-pixel G on the display layer 10.

If one brightness detecting unit 21 in one brightness detecting unit group 20 can be irradiated by yellow light emitted by one pixel in the corresponding display unit 11, and the orthographic projection of the brightness detecting unit 21 on the display layer 10 is overlapped respectively with one half of the arranging area of the red sub-pixel R in the pixel on the display layer 10, one third of the arranging area of the green sub-pixel G in the pixel on the display layer 10, and one quarter of the arranging area of the blue sub-pixel B in the pixel on the display layer 10, each of other brightness detecting units 21 in the brightness detecting unit group 20 can also be irradiated by the yellow light emitted by one pixel in the corresponding display unit 11, and the orthographic projection of each of the brightness detecting units 21 on the display layer 10 is overlapped with one half of the arranging area of the red sub-pixel R in the corresponding pixel on the display layer 10, one third of the arranging area of the green sub-pixel G in the corresponding pixel on the display layer 10, and one quarter of the arranging area of the blue sub-pixel B in the corresponding pixel on the display layer 10.

Some arrangements of the present disclosure do not limit the setting of the overlapping area corresponding to each of the brightness detecting units 21 in each brightness detecting unit group 20, as long as the portions, lying in the corresponding overlapping areas, of the display units 11 corresponding to different brightness detecting units 21 in the same brightness detecting unit group 20 are same. In addition, some arrangements of the present disclosure do not limit the number of the brightness detecting unit groups 20, that is, the display device 100 may include one brightness detecting unit group 20, or include a plurality of brightness detecting unit groups 20

It is described above that the display units 11 display the same image data, which means that same image data signal is input to the sub-pixels in the display units 11 corresponding to the different brightness detecting units 21 of the same brightness detecting unit group 20, so that the brightness of the light emitted from the sub-pixels in the plurality of display units 11 and irradiated on the corresponding brightness detecting units 21 is the same theoretically.

For example, if each of the display units 11 corresponding to the different brightness detecting units 21 in the same brightness detecting unit group 20 includes only a green sub-pixel, the same image data signal is input to the green sub-pixel in each of the display units 11 corresponding to each of the brightness detecting units 21 in the same brightness detecting unit group 20.

Of course, if each of the display units 11 corresponding to the different brightness detecting units 21 in the same brightness detecting unit group 20 includes one pixel including a red sub-pixel R, a green sub-pixel G, and a blue sub-pixel B, the same image data signal is input to the green sub-pixel G in each of the display units 11 corresponding to each of the brightness detecting units 21 in the same brightness detecting unit group 20, the same image data signal is input to the red sub-pixel R in each of the display units 11 corresponding to each of the brightness detecting units 21 in the same brightness detecting unit group 20, and the same image data signal is input to the blue sub-pixel B in each of the display units 11 corresponding to each of the brightness detecting units 21 in the same brightness detecting unit group 20.

The actual brightness data of the display unit 11 corresponding to each of the brightness detecting units 21 refers to the brightness of the light emitted from the display unit 11 corresponding to each of the brightness detecting units 21 and actually irradiated on the brightness detecting unit 21. It is described above that the target brightness data is determined according to the image data displayed by the corresponding display unit 11, which means that the brightness of the light theoretically irradiated on the brightness detecting unit 21 corresponding to the display unit 11 is obtained according to the image data input to the display unit 11.

It can be understood that the control module 30 determining whether the actual brightness data coincides with the target brightness data, which refers to whether the difference between the actual brightness data and the corresponding target brightness data exceeds a preset range, and the "preset range" is 0, or a range containing at least two data.

In some examples, the preset range is 0, that is, if the actual brightness data detected by the brightness detecting unit 21 and the corresponding target brightness data are different, the brightness compensation data required for the display unit 11 corresponding to the brightness detecting unit 21 can be obtained according to the difference therebetween.

In other examples, the preset range is a range including at least two data, for example, the preset range is [−2, 2], and if the difference between the actual brightness data detected by the brightness detecting unit 21 and the corresponding target brightness data exceeds the range of [−2, 2], the brightness compensation data required for the display unit 11 corresponding to the brightness detecting unit 21 can be obtained based on the difference therebetween.

In some arrangements, the plurality of brightness detecting units 21 in the same brightness detecting unit group 20 simultaneously detect the actual brightness data of the display units 11 corresponding to the plurality of brightness detecting units 21; or, the plurality of brightness detecting units 21 in the same brightness detecting unit group 20 detect the actual brightness data of the display units 11 corresponding to the plurality of brightness detecting units 21 one by one. Of course, it is also possible that the plurality of brightness detecting units 21 in the same brightness detecting unit group 20 can be divided into a plurality of batches, and the plurality of brightness detecting units 21 in each batch are controlled to simultaneously detect the actual brightness data of the display units 11 corresponding to the batch of brightness detecting units 21. Further, the plurality of brightness detecting units 21 in different brightness detecting unit groups 20 may simultaneously detect or individually detect the actual brightness data of the display units 11 corresponding to the plurality of brightness detecting units 21. Some arrangements of the present disclosure do not limit thereto.

In some arrangements of the present disclosure, at least one brightness detecting unit group 20 is disposed on the light emitting side of the display layer 10 in the display device 100, the plurality of brightness detecting units 21 in each of the brightness detecting unit groups 20 can be used to respectively detect the actual brightness data of the display units 11 corresponding to the plurality of brightness detecting units 21, the actual brightness data detected by each of the brightness detecting units 21 is transmitted to the control module 30, and in case where the control module 30 determines that the actual brightness data does not coincide with the target brightness data, the control module 30 determines the brightness compensation data of the display unit 11 to which the actual brightness data belongs according to the difference between the actual brightness data and the corresponding target brightness data, to perform brightness compensation on the corresponding display unit 11 by using the brightness compensation data, thus effectively solving the problem that the brightness of the display device 100 is uneven.

Figure 5:
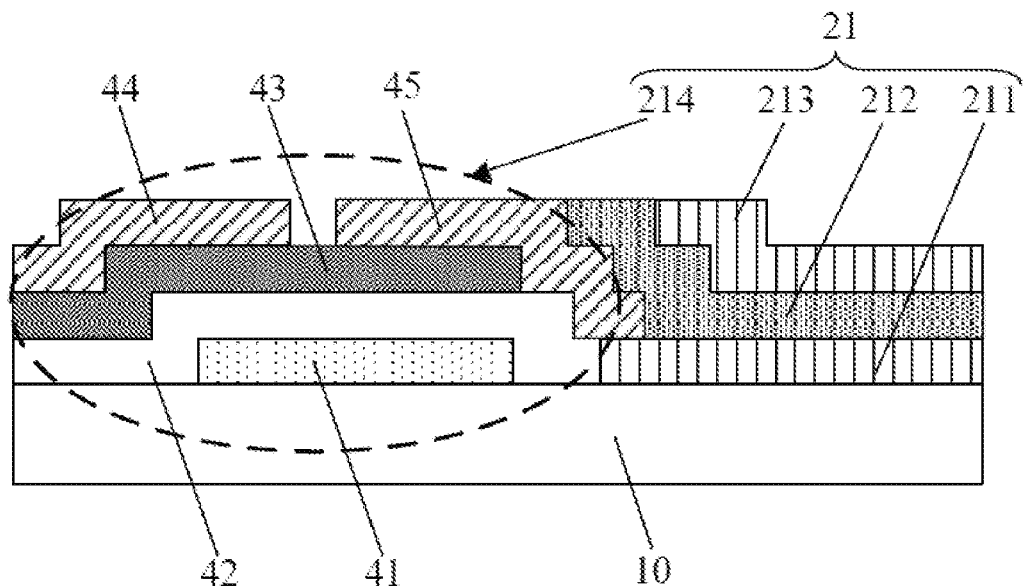
FIG. 5 is a schematic structural diagram of a brightness detecting unit according to some arrangements of the present disclosure.

In some arrangements, as shown in FIG. 5, each of the brightness detecting units 21 includes a first electrode 211, a photosensitive layer 212, and a second electrode 213 which are sequentially disposed in a direction away from the display layer 10. The resistance value of the photosensitive layer 212 varies according to the intensity of the light irradiated thereto. That is, the resistance value of the photosensitive layer 21 tends to vary after being exposed to light, and have different resistance values according to different light intensities. The control module 30 is coupled to the first electrode 211 and the second electrode 213 in each of the brightness detecting units 21, and the control module 30 is configured to input different potentials to the first electrode 211 and the second electrode 213 in each of the brightness detecting units 21 and acquire a current output by the corresponding brightness detecting unit through the first electrode 211 or the second electrode 213 in each of the brightness detecting units 21, to determine the actual brightness data of the display unit 11 corresponding to each of the brightness detecting units 21 according to the current.

The control module 30 inputs a first potential to the first electrode 211 of each of the brightness detecting units 21, and inputs a second potential to the second electrode 213 of each of the brightness detecting units 21. Since the first potential and the second potential are different, a fixed voltage is provided between the first electrode 211 and the second electrode 213 in each of the brightness detecting units 21 to ensure that the photosensitive layer 212 is in an operating state. Thus, the resistance value of the photosensitive layer 212 changes after being irradiated, so that the current output from the first electrode 211 or the second electrode 213 of each of the brightness detecting units 21 also changes, thus ensuring that the current output from each of the brightness detecting units 21 after being irradiated can indicate the actual brightness data of the corresponding display unit 11.

In each of the brightness detecting units 21, the first electrode 211 is disposed on a side of the photosensitive layer 212 adjacent to the display layer 10, and the first electrode 211 is a transparent electrode, so that the first electrode 211 does not block the optical signal emitted from the display layer 10 to the photosensitive layer 212, which can facilitate the photosensitive layer 212 to sensitively detect the light emitted from the corresponding display unit 11. Moreover, in some arrangements, the first electrode 211 is a comb-shaped electrode that can further avoid blocking the optical signal emitted from the display layer 10 to the photosensitive layer 212.

Some arrangements of the present disclosure do not limit the materials of the photosensitive layer 212 and the second electrode 213. For example, the photosensitive layer 212 is formed of at least one of lead sulfide, indium tin zinc oxide, or indium gallium zinc oxide. The second electrode 213 is formed of a metal or a transparent conductive material.

Here, in view of that each of the brightness detecting units 21 is disposed on the light emitting side of the display layer 10, and the orthographic projection of each of the brightness detecting units 21 on the display layer 10 has an overlapping area with the arranging area of the corresponding display unit 11 on the display layer 10, in some arrangements, the first electrode 211 and the second electrode 213 are both transparent electrodes, and the photosensitive layer 212 is a photosensitive transparent layer, which can prevent the brightness detecting unit 21 from affecting the aperture ratio of the display device 100. Further, in some arrangements of the present disclosure, each of the brightness detecting units 21 is composed of the first electrode 211, the photosensitive layer 212, and the second electrode 213, which is simple in structure and easy to be fabricated.

In some arrangements, referring to FIG. 5, each of the brightness detecting units 21 further includes a switching transistor 214 having a drain electrode 45 coupled to the first electrode 211 or the second electrode 213 in the same brightness detecting unit 21, and a source electrode 44 and a gate electrode 41 coupled to the control module 30, respectively. Each of the switching transistors 214 is configured to, after being controlled to be turned on by the control module 30, input the current output from the first electrode 211 or the second electrode 213 coupled to the drain electrode 45 thereof, to the control module 30.

Further, as shown in FIG. 5, each of the switching transistors 214 further includes a gate insulating layer 42 disposed on a surface of the gate electrode 41 adjacent to the source electrode 44, and an active layer 43 disposed on the surface of the gate insulating layer 42 adjacent to the source electrode 44, and the source electrode 44 and the drain electrode 45 are coupled to the active layer 43, respectively.

Some arrangements of the present disclosure do not limit the type of switching transistor 214. For example, the aforementioned switching transistor 214 is an amorphous silicon thin film transistor (TFT), a polysilicon TFT, an oxide TFT, an organic material TFT, or the like. Since the flexibility of the organic material is stronger and thus more suitable for the flexible display device, in some arrangements, each of the switching transistors 214 is an organic TFT.

Figure 6:
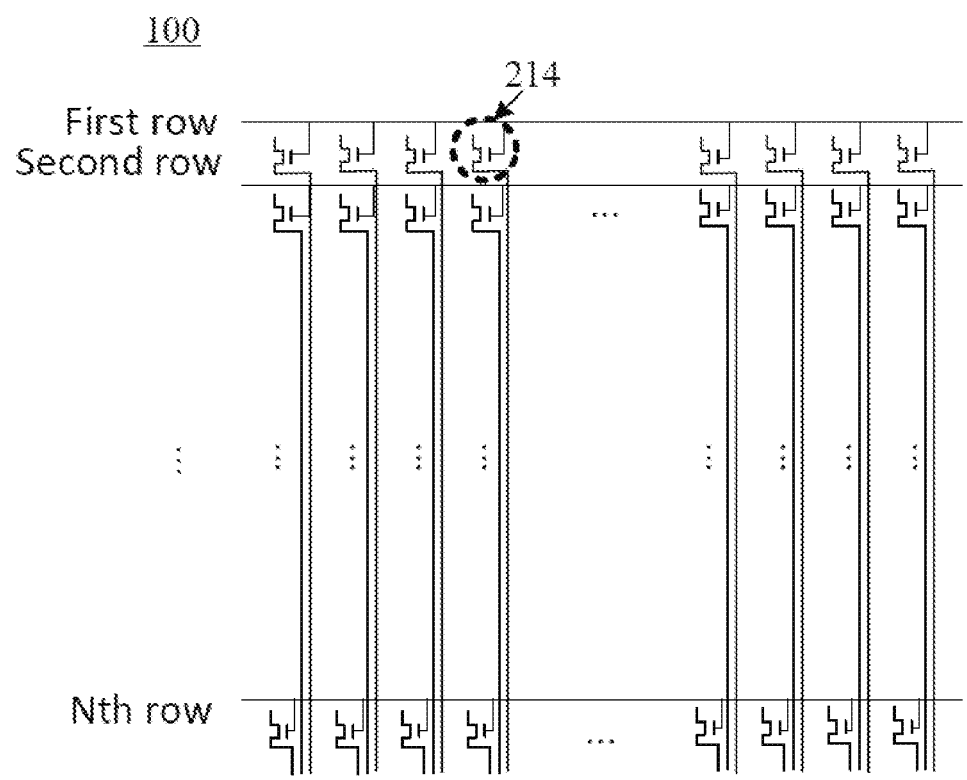
FIG. 6 is a diagram of positional distribution of switching transistors in a display device according to some arrangements of the present disclosure.
Figure 7:
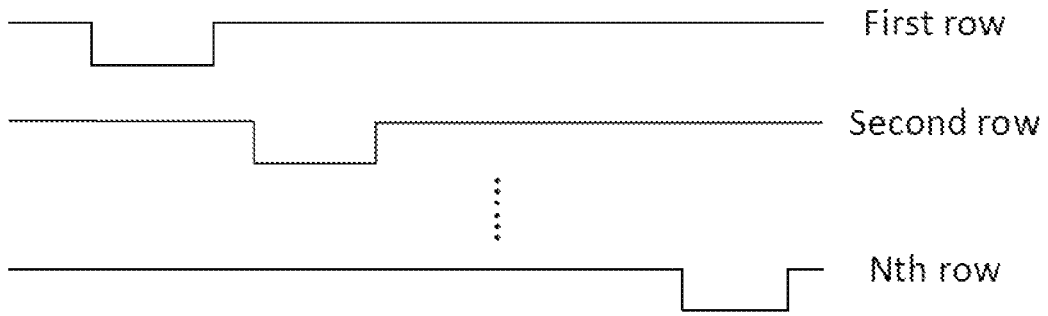
FIG. 7 is a timing control diagram of switching transistors in a display device according to some arrangements of the present disclosure.

In addition, if the switching transistor 40 is a PMOS transistor, when the control module 30 inputs a low level signal to the gate electrode 41 of the switching transistor 214, the switching transistor 40 is turned on to be in an operation state, and when the control module 30 inputs a high level signal to the gate electrode 41 of the switching transistor 214, the switching transistor 40 is turned off to be in a non-operation state. For example, the switching transistors 214 in the display device 100 are arranged in an array, such as shown in FIG. 6. Correspondingly, when the switching transistors 214 in the display device 100 are controlled to be turned on row by row, the control timings corresponding to the respective switching transistors 214 are as shown in FIG. 7, and the plurality of switching transistors 214 in the same row are turned on under the control of the same timing control signal.

In some arrangements of the present disclosure, the control module 30 controls the turning on or off of the switching transistors 214 in the respective brightness detecting units 21, and can effectively control whether each of the brightness detecting units 21 performs brightness detection and outputs the actual brightness data detected by the brightness detecting unit 21, to achieve actual brightness detection of the target display unit. The target display units are all or a part of the display units 11 in the display unit 10.

Of course, in other arrangements, each of the brightness detecting units 21 can also send output current thereof to the control module 30 through other conductive structures, such as wires.

Figure 3:
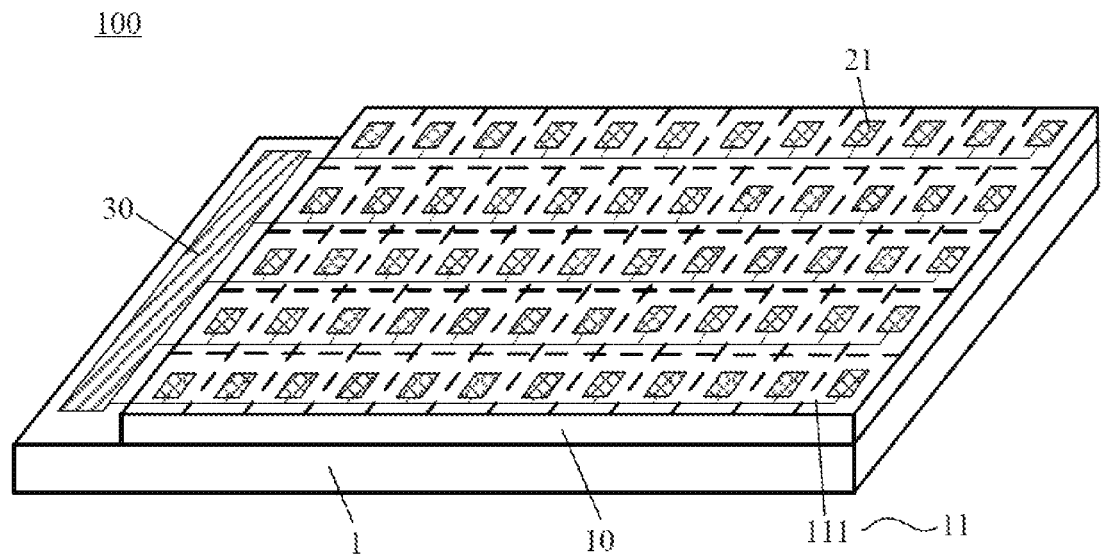
FIG. 3 is a schematic structural diagram of another display device according to some arrangements of the present disclosure.
Figure 4:
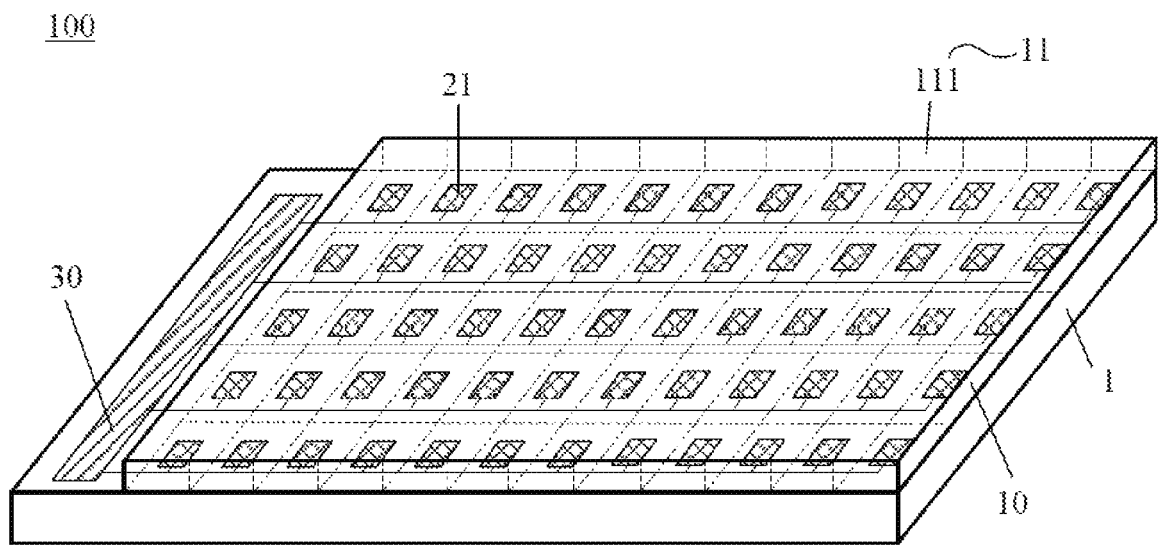
FIG. 4 is a schematic structural diagram of another display device according to some arrangements of the present disclosure.

In some arrangements, referring to FIG. 3 and FIG. 4, each of the display units 11 is one sub-pixel 111, and each sub-pixel 111 corresponds to one brightness detecting unit 21.

In view of the above, the display device 100 further includes an array substrate 1 including a pixel driving circuit disposed corresponding to each of the sub-pixels 111, and each of the pixel driving circuits includes a driving transistor (not shown). The at least one brightness detecting unit group 20 described above is disposed on a side of the display layer 10 away from the array substrate 1 (for example, as shown in FIG. 3) or on a side of the display layer 10 adjacent to the array substrate 1 (for example, as shown in FIG. 4). It should be noted that if the display side of the display device 100 is the side where the brightness detecting unit group 20 is located, the disposing of each of the brightness detecting units 21 in the brightness detecting unit group 20 shall not affect the normal display of the corresponding display unit 11.

In some examples, the source electrode 44 of the switching transistor 214 and the source electrode of the driving transistor corresponding to the same sub-pixel 111 are coupled to each other, that is, the source electrode 44 of the switching transistor 214 and the source electrode of the driving transistor corresponding to the same sub-pixel 111 are input with the same voltage signal, such as the same power supply signal VDD input by the control module 30. This can reduce the total number of signal lines, thus simplifying the wiring structure in the display device 100.

In addition, in some examples, the gate electrode 41 of the switching transistor 214 and the gate electrode of the driving transistor corresponding to the same sub-pixel 111 are coupled to each other, that is, the gate electrode 41 of the switching transistor 214 and the gate electrode of the driving transistor corresponding to the same sub-pixel 111 are input with the same voltage signal, such as a row driving signal input by the control module 30. Thus, the switching transistors 214 in the respective brightness detecting units 20 can be operated row by row as shown in FIG. 7. That is, while the display units 11 of the corresponding row are displaying, the detection of the actual brightness data of the corresponding display units 11 are simultaneously performed. This can reduce the workload of the control module 30, and can optimize the control of the control module 30.

Of course, the gate electrode 41 of the switching transistor 214 and the gate electrode of the driving transistor corresponding to the same sub-pixel 111 can receive different control signals, but it has to be ensured that while the plurality of display units 11 of any one row are displaying, the switching transistor 214 in the brightness detecting unit 21 corresponding to each of the display units 11 in the row is in the operation state, to transmit the actual brightness data of each of the display units 11 to the control module 30.

In addition, when a flexible printed circuit (FPC) board is disposed in the display device 100, the source electrode 44 of the switching transistor 214 and the source electrode of the driving transistor corresponding to the same sub-pixel 111 may be input with a voltage signal from the flexible circuit board. The gate electrode 41 of the switching transistor 214 and the gate electrode of the driving transistor corresponding to the same sub-pixel 111 may also be input with a row driving signal by the flexible circuit board. When a gate on substrate (GOA) circuit is provided in the array substrate 1 of the display device 100, the gate electrode 41 of the switching transistor 214 and the gate of the driving transistor corresponding to the same sub-pixel 111 may be input with the row driving signal by the GOA circuit.

It should be noted that each of the sub-pixels 111 corresponds to one brightness detecting unit 21, which means that the display device 100 includes a plurality of sub-pixels 111, and the arranging area of each of the sub-pixels 111 on the display layer 10 has an overlapping area with the orthographic projection of one brightness detecting unit 21 on the display layer 10, so that one brightness detecting unit 21 is configured to detect the actual brightness data of one sub-pixel 111, and the actual brightness data of each sub-pixel 111 can be detected more accurately, thus obtaining the brightness compensation data required for each sub-pixel 111 to compensate each sub-pixel 111 more accurately.

Figure 8:
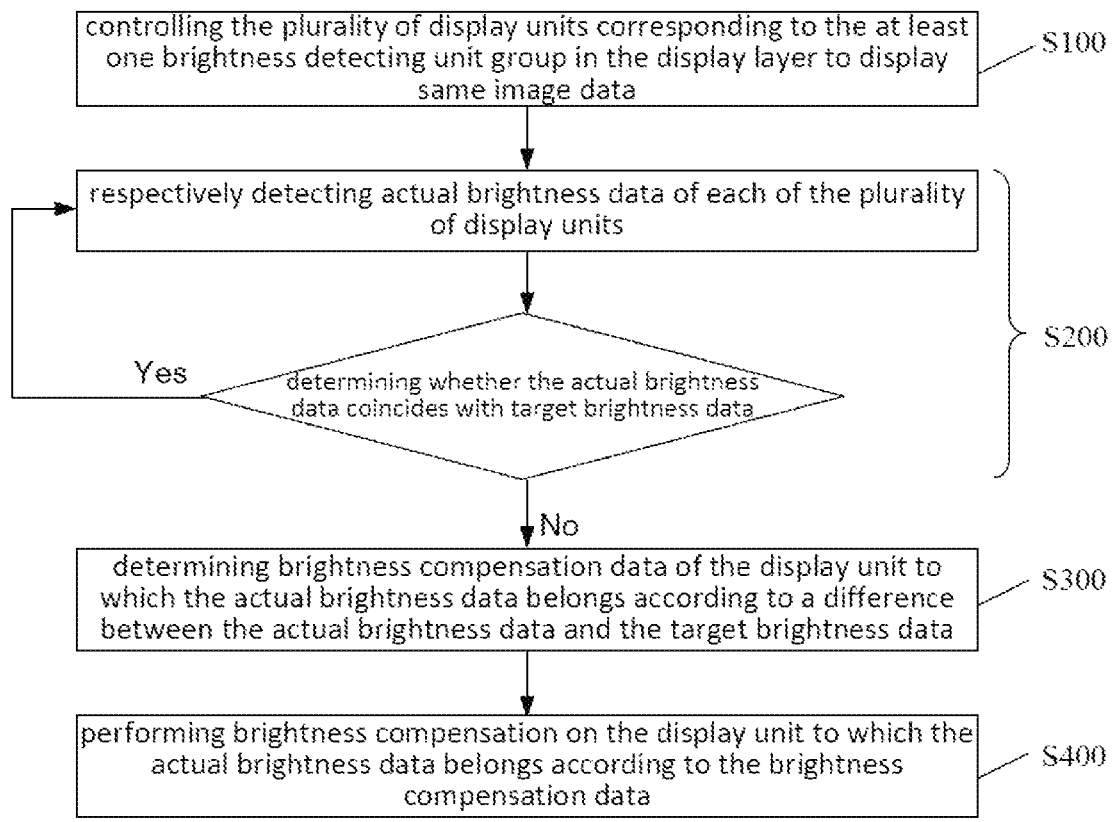
FIG. 8 is a flowchart of a brightness detecting method of a display device, according to some arrangements of the present disclosure.

Some arrangements of the present disclosure provide a brightness detecting method of the display device 100 for detecting the display device 100 as described in some arrangements above. Referring to FIG. 8, the brightness detecting method includes blocks S100-S300.

In block S100, the plurality of display units 11 in the display layer 10 are controlled to display same image data. The plurality of display units 11 correspond to at least one brightness detection unit group 20.

In blocks S200, actual brightness data of each of the plurality of display units 11 is detected respectively, and it is determined whether the actual brightness data coincides with target brightness data.

In block S300, if the actual brightness data does not coincide with the target brightness data, brightness compensation data of the display unit 11 to which the actual brightness data belongs is determined according to difference between the actual brightness data and the target brightness data.

Here, each of the brightness detecting units 21 in each of the brightness detecting unit groups 20 is configured to detect the brightness of the emitted light during displaying of the corresponding display unit 11. In some examples, each of the display units 11 is one sub-pixel 111, and each sub-pixel 111 corresponds to one brightness detecting unit 21.

Some arrangements of the present disclosure do not limit the structure of the module for detecting the actual brightness data of the corresponding display unit 11 in the brightness detecting method, and the structure of the module for determining whether the actual brightness data coincides with the target brightness data, as long as it has the corresponding functions described above.

In block S100, the plurality of display units 11 in the display layer 10 are controlled to display same image data, which means that the same image data signal is input to the sub-pixels of the plurality of display units 11 in the display layer 10, so that the brightness of lights emitted from the sub-pixels in the plurality of display units 11 is theoretically the same.

For example, if each of the display units 11 corresponding to the different brightness detecting units 21 in the same brightness detecting unit group 20 includes only a green sub-pixel, the same image data signal is input to the green sub-pixel in each of the display units 11 corresponding to each of the brightness detecting units 21 in the same brightness detecting unit group 20.

Of course, if each of the display units 11 corresponding to the different brightness detecting units 21 in the same brightness detecting unit group 20 includes one pixel including a red sub-pixel R, a green sub-pixel G, and a blue sub-pixel B, the same image data signal is input to the green sub-pixel G in each of the display units 11 corresponding to each of the brightness detecting units 21 in the same brightness detecting unit group 20, the same image data signal is input to the red sub-pixel R in each of the display units 11 corresponding to each of the brightness detecting units 21 in the same brightness detecting unit group 20, and the same image data signal is input to the blue sub-pixel B in each of the display units 11 corresponding to each of the brightness detecting units 21 in the same brightness detecting unit group 20.

The plurality of display units 11 described above display the same image data, the plurality of display units 11 are of the same size, and the colors of the lights emitted from the respective display units 11 are the same, that is, each of the plurality of display units 11 has the same size, each of the plurality of display units 11 has the same number of sub-pixels, and each of the plurality of display units 11 has sub-pixels of the same size for emitting light of each color. The description of the display units 11 and the corresponding brightness detecting unit 21 can refer to related descriptions in some arrangements, and details will not be repeated herein.

It can be understood that it is determined whether the actual brightness data coincides with target brightness data in blocks S200, which refers to comparing the actual brightness data and the target brightness data to determine whether the difference therebetween exceeds a preset range, and the "preset range" is 0, or a range containing at least two data.

In some examples, the preset range is 0, that is, if the actual brightness data and the corresponding target brightness data are different, the brightness compensation data required for the display unit 11 to which the brightness compensation data belongs can be obtained according to the difference therebetween.

In other examples, the preset range is a range including at least two data, for example, the preset range is [−2, 2], and if the difference between the actual brightness data and the corresponding target brightness data exceeds the range of [−2, 2], the brightness compensation data required for the display unit 11 to which the brightness compensation data belongs can be obtained based on the difference therebetween.

Further, the brightness compensation data and the brightness displayed by the corresponding display unit 11 satisfy a certain function relationship, for example, the function relationship is a linear function relationship.

In blocks S200, actual brightness data of each of the plurality of display units 11 is detected respectively, which includes simultaneously detecting actual brightness data of the plurality of display units 11, or detecting actual brightness data of the plurality of display units 11 one by one, or the actual brightness data of the plurality of display units 11 is detected in batches. The actual brightness data of the display units 11 of each batch is simultaneously detected.

In some arrangements, referring to FIG. 8, the brightness detecting method of the display device 100 further includes block S400.

In block S400, brightness compensation is performed on the display unit 11 to which the corresponding actual brightness data belongs according to each brightness compensation data.

Here, the brightness compensation for each display unit 11 can be performed during the image displaying by the display device 100 to ensure that the brightness of the image displayed by the display device 100 is uniform. Of course, the brightness compensation for each display unit 11 can also be performed in the process of performing brightness detection on each display unit 11 in the display device 100, to correct the brightness compensation data required for each display unit 11 by secondary detection, to further ensure that the display device 100 has uniform displaying brightness during subsequent image displaying.

In some arrangements of the present disclosure, by detecting actual brightness data of each of the plurality of display units 11 configured to display the same image data, and when determining that the actual brightness data does not coincide with the target brightness data, brightness compensation data of the display unit 11 to which the actual brightness data belongs can be determined according to the difference between the actual brightness data and the target brightness data, to perform brightness compensation on the display unit 11 with the brightness compensation data, thus it can effectively solve the problem that the display device 100 displays uneven brightness.

In some examples, each display unit 11 is one sub-pixel 111, and each sub-pixel 111 corresponds to one brightness detecting unit 21. In blocks S200, actual brightness data of each of the plurality of display units 11 is detected respectively, which further includes detecting the actual brightness data of each of the sub-pixels in the display layer.

In some arrangements of the present disclosure, by making each sub-pixel 111 in the display device 100 correspond to one brightness detecting unit 21, the actual brightness data of each sub-pixel 111 can be detected more accurately, thus obtaining the brightness compensation data required for each sub-pixel 111, to compensate each sub-pixel 111 more accurately.

In some examples, the plurality of display units 11 are arranged in an array. In blocks S200, actual brightness data of each of the plurality of display units 11 is detected respectively, which further includes detecting actual brightness data of each of the plurality of display units 11 row by row. Thus, the workload of the control module 30 can be reduced and the control of the control module 30 can be optimized.

For the process of detecting the actual brightness data of each of the plurality of display units 11 row by row described above, please refer to the related content recited in the arrangements described above, and details will not be repeated herein.

In the description of the above arrangements, specific features, structures, materials or characteristics may be combined in any suitable manner in any one or more arrangements or examples.

The above is only specific arrangements of the present disclosure, but the scope of the present disclosure is not limited thereto, and any changes or substitutions easily contemplated by any person skilled in the art within the technical scope of the disclosure should be within the protection scope of the present disclosure. Therefore, the protection scope of the present disclosure should be subject to the scope of the claims.

What is claimed is:

1. A display device, comprising:
   a display layer, comprising a plurality of display units, each of the display units comprising a plurality of sub-pixels;
   at least one sensor group, disposed on a light emitting side of the display layer, and each comprising a plurality of sensors, wherein an orthographic projection of one of the sensors on the display layer has an overlapping area with an arranging area of one of the display units on the display layer, respective portions, lying in overlapping areas, of the display units corresponding to different sensors in the same sensor group are the same, and the orthographic projection of the one of the sensors on the display layer is overlapped with a part of an arranging area of each of the plurality of sub-pixels comprised in the one of the display units on the display layer; and
   a processor, coupled to each of the sensors,
   wherein the plurality of sensors in the same sensor group are configured to, when corresponding display units display same image data, respectively detect actual brightness data of the respective display unit corresponding to each of the sensors, and transmit a plurality of actual brightness data to the processor, and
   the processor is configured to receive the actual brightness data transmitted by each of the sensors, and when the actual brightness data does not coincide with target brightness data, determine brightness compensation data of the display unit to which the actual brightness data belongs according to a difference between the actual brightness data and the target brightness data.

2. The display device according to claim 1, wherein each of the sensors comprises a first electrode, a photosensitive layer, and a second electrode which are sequentially disposed in a direction away from the display layer, and a resistance value of the photosensitive layer varies according to an intensity of light irradiated on the photosensitive layer; and
   the processor is coupled to the first electrode and the second electrode in each of the sensors, and the processor is configured to apply different potentials to the first electrode and the second electrode in each of the sensors and acquire current output by each of sensors from one of the first electrode and the second electrode in each of the sensors, to determine the actual brightness data of the respective display unit corresponding to each of the sensors according to the current.

3. The display device according to claim 2, wherein each of the sensors further comprises a switching transistor, and the switching transistor comprises a drain electrode coupled to one of the first electrode and the second electrode, and a source electrode and a gate electrode respectively coupled to the processor; and
   the switching transistor is configured to, after being turned on by the processor, input the current output from the one of the first electrode and the second electrode coupled to the drain electrode to the processor.

4. The display device according to claim 2, wherein the first electrode is a transparent electrode.

5. The display device according to claim 4, wherein the photosensitive layer is a photosensitive transparent layer.

6. The display device according to claim 5, wherein the second electrode is a transparent electrode.

7. A brightness detecting method for a display device comprising:
- a display layer, comprising a plurality of display units, each of the display units comprising a plurality of sub-pixels;
- at least one sensor group, disposed on a light emitting side of the display layer, and each comprising a plurality of sensors, wherein an orthographic projection of one of the sensors on the display layer has an overlapping area with an arranging area of one of the display units on the display layer, respective portions, lying in overlapping areas, of the display units corresponding to different sensors in the same sensor group are the same, and the orthographic projection of the one of the sensors on the display layer is overlapped with a part of an arranging area of each of the plurality of sub-pixels comprised in the one of the display units on the display layer; and
- a processor, coupled to each of the sensors,
the brightness detecting method comprising:
- controlling the plurality of display units in the display layer to display same image data, the plurality of display units corresponding to the at least one sensor group;
- respectively detecting actual brightness data of each of the plurality of display units, and determining whether the actual brightness data coincides with target brightness data; and
- determining brightness compensation data of the display unit to which the actual brightness data belongs according to a difference between the actual brightness data and the target brightness data when the actual brightness data does not coincide with the target brightness data.

8. The brightness detecting method according to claim 7, further comprising:
- performing brightness compensation on the display unit to which the actual brightness data belongs according to the brightness compensation data.

9. The brightness detecting method according to claim 7, wherein
the a plurality of sub-pixels correspond to one of the sensors; and
respectively detecting actual brightness data of each of the plurality of display units further comprises:
- respectively detecting the actual brightness data of the plurality of sub-pixels in the display layer.

10. The brightness detecting method according to claim 9, wherein
the plurality of display units are arranged in an array; and
respectively detecting actual brightness data of each of the plurality of display units further comprises:
- detecting the actual brightness data of each of the plurality of display units row by row.

11. The display device according to claim 1, wherein the orthographic projection of any one of the sensors on the display layer is at least partially overlapped with the arranging area of only one of the display units on the display layer, and is not overlapped with the arranging areas of other display units than the only one on the display layer.

12. The display device according to claim 1, wherein the overlapping areas of the orthographic protections of the sensors in any one of the sensor groups on the display layer with the arranging areas of corresponding display units on the display layer have same ranges.

13. The display device according to claim 12, wherein when the display units are configured to emit colored light, colors on corresponding sensors due to irradiation by light emitted from portions of different display units lying in the overlapping areas are the same.

14. The brightness detecting method according to claim 7, wherein each of the sensors comprises a first electrode, a photosensitive layer, and a second electrode which are sequentially disposed in a direction away from the display layer, and a resistance value of the photosensitive layer varies according to an intensity of light irradiated on the photosensitive layer; and
the processor is coupled to the first electrode and the second electrode in each of the sensors, and the processor is configured to apply different potentials to the first electrode and the second electrode in each of the sensors and acquire current output by each of sensors from one of the first electrode and the second electrode in each of the sensors, to determine the actual brightness data of the display unit corresponding to each of the sensors according to the current.

15. The brightness detecting method according to claim 14, wherein each of the sensors further comprises a switching transistor, and the switching transistor comprises a drain electrode coupled to one of the first electrode and the second electrode, and a source electrode and a gate electrode respectively coupled to the processor; and
the switching transistor is configured to, after being turned on by the processor, input the current output from the one of the first electrode and the second electrode coupled to the drain electrode to the processor.

16. The brightness detecting method according to claim 14, wherein the first electrode is a transparent electrode.

17. The brightness detecting method according to claim 16, wherein the photosensitive layer is a photosensitive transparent layer.

* * * * *